United States Patent [19]

Clark et al.

[11] Patent Number: 5,202,656

[45] Date of Patent: Apr. 13, 1993

[54] FREQUENCY SHIFTING TUNING PROCESS AND FILTER STRUCTURE

[75] Inventors: Gary J. Clark, Constantia; Joseph A. Zennamo, Jr., Skaneateles, both of N.Y.

[73] Assignee: Eagle Comtronics, Inc., Clay, N.Y.

[21] Appl. No.: 780,308

[22] Filed: Oct. 22, 1991

[51] Int. Cl.⁵ ............................................. H03H 7/00
[52] U.S. Cl. ...................................... 333/174; 333/176; 333/185
[58] Field of Search ................... 333/12, 168, 174, 1, 333/176, 185, 17.1

[56] References Cited

U.S. PATENT DOCUMENTS

| | | | |
|---|---|---|---|
| 2,991,436 | 7/1961 | Banton | 333/174 X |
| 3,644,848 | 2/1972 | Kruczek | 333/185 |
| 4,123,732 | 10/1978 | Daniel | 333/174 |
| 4,433,315 | 2/1984 | Vandegraaf | 333/174 |
| 4,451,803 | 5/1984 | Holdsworth et al. | 333/12 |
| 4,701,726 | 10/1987 | Holdsworth | 333/185 |
| 4,845,447 | 7/1989 | Holdsworth | 333/185 X |
| 4,901,043 | 2/1990 | Palinkas | 333/185 X |

Primary Examiner—Robert J. Pascal
Assistant Examiner—Seung Ham
Attorney, Agent, or Firm—Parkhurst, Wendel & Rossi

[57] ABSTRACT

A technique is disclosed to independently tune different sections of a filter by momentarily frequency shifting a first tuned section, preferably by shorting certain nodes in the first tuned section, such that response of a second section can be determined and independently tuned. The first section is returned to normal operation after the second section is tuned.

6 Claims, 7 Drawing Sheets

FIG. I

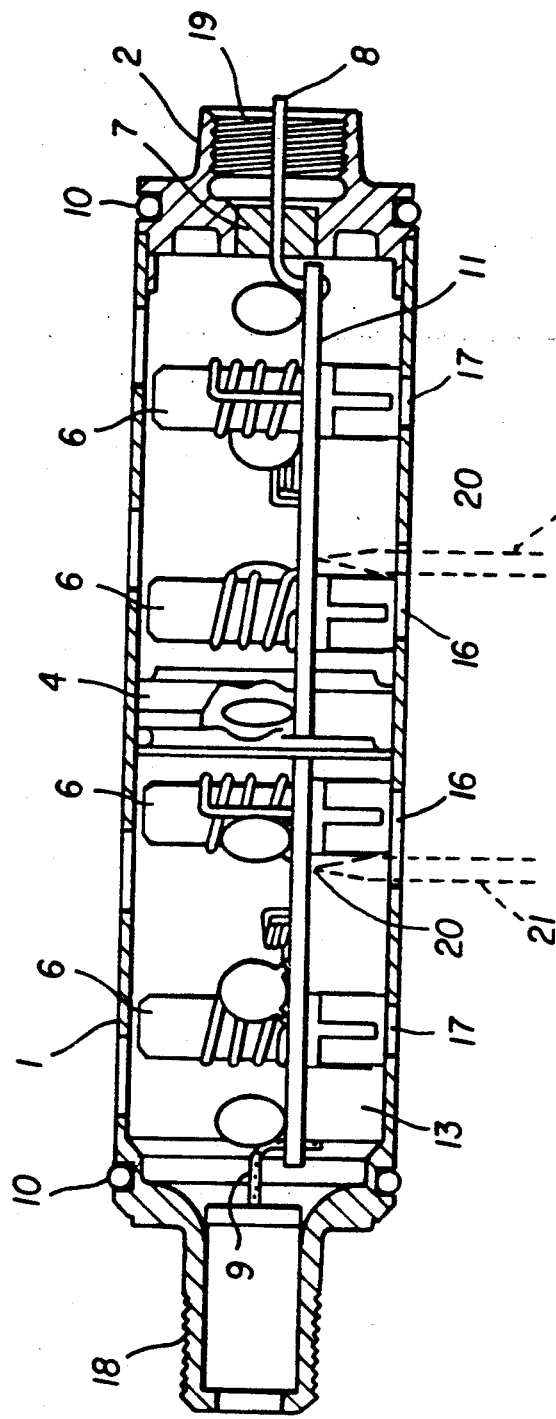
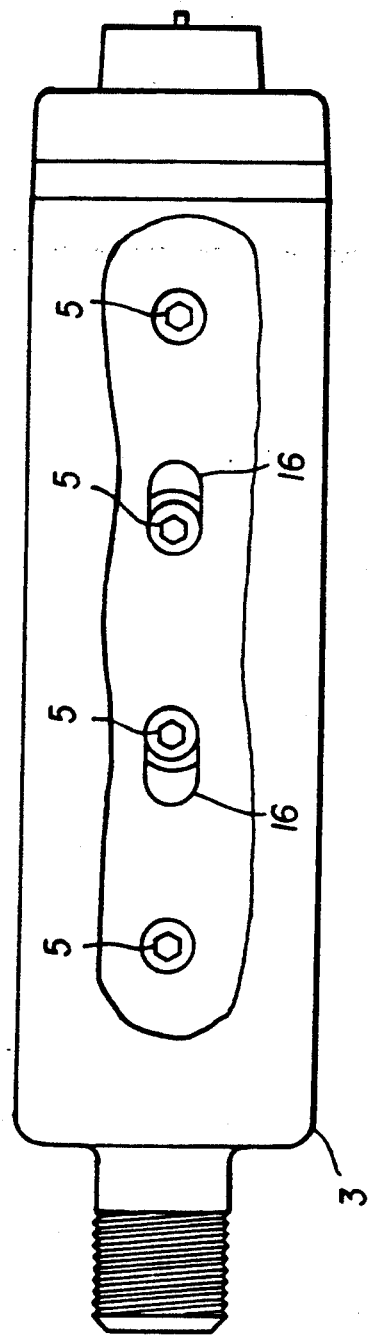
FIG. 3A
FIG. 3B

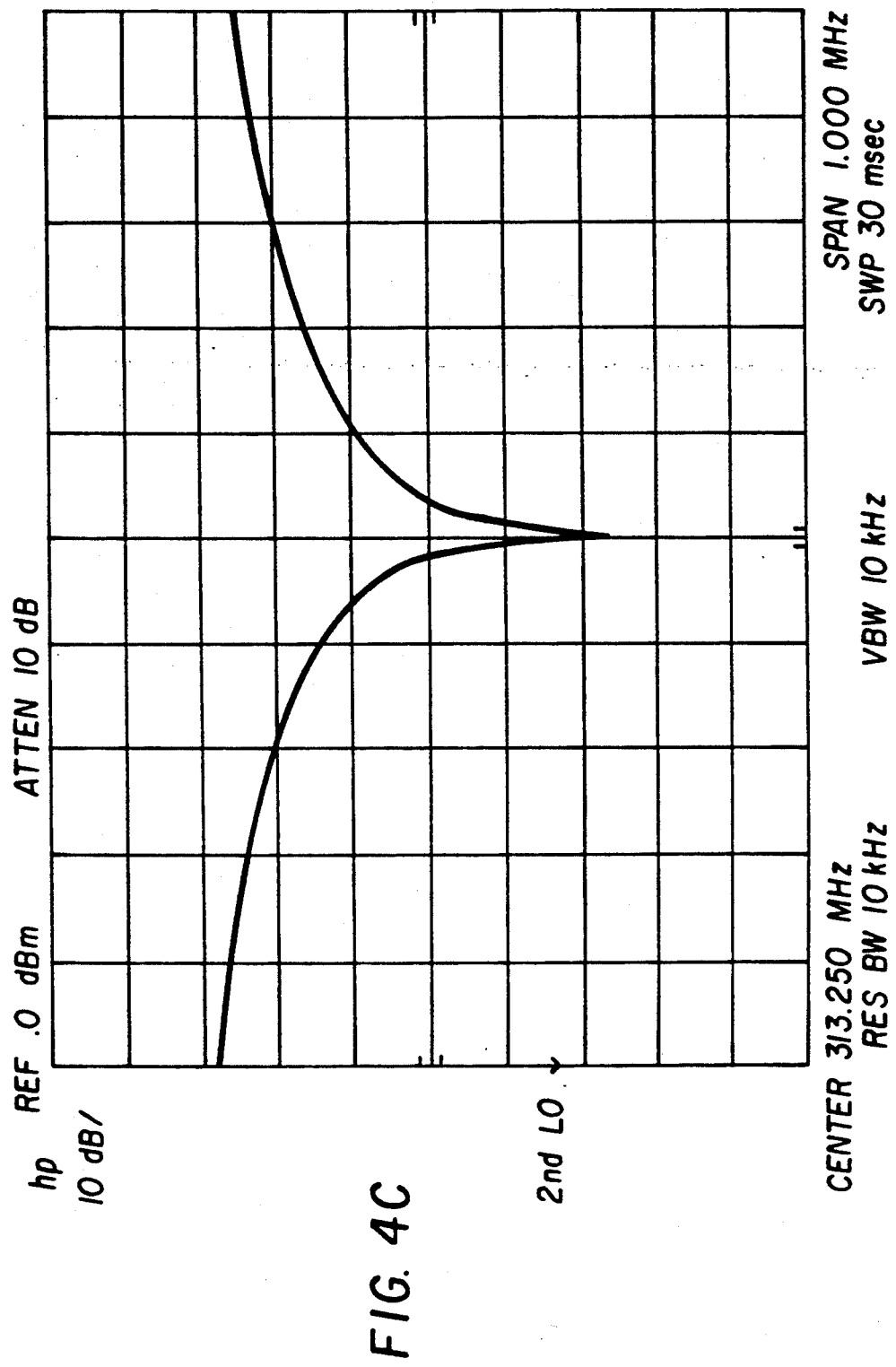

FREQUENCY SHIFTING TUNING PROCESS AND FILTER STRUCTURE

BACKGROUND

The present invention relates to tuned filters and, more particularly, to notch filters which are particularly suitable for use in removing one or more single or multiple frequency scrambling signals injected into a TV channel to eliminate the possibility of intelligible reception of video and/or audio information, or for removing a video carrier in a TV channel to prevent its reception.

A critical requirement of tuned notch filters, used in the above-described environments, is that the filters have a high degree of stability and reliability. In addition, the filters must also be economically constructed in such a manner to permit the filters to be quickly and precisely tuned to the proper frequency in order to ensure complete elimination of the signals to be removed. A further requirement of tuned notch filters is that the size of the filter must remain relatively small, preferably less than 0.825 inch diameter, to fit the application in a typical installation where one or more filters are mounted on a directional tap, on a strand, in a pedestal, or some other small enclosure.

Notch filters typically used in the environments described above must be capable of approximately 85 dB of attenuation at the center frequency of the notch with a very sharp skirt to minimize unwanted attenuation of adjacent channels. In order to tune such a filter, sophisticated and expensive tuning equipment is required to measure this large degree of attenuation across the filter. Tuning is further complicated by the fact that notch filters used for the purposes described above typically employ more than one filter section in cascade to achieve the high attenuation, wherein each of filter sections must be independently tuned. If sufficient isolation is not provided between the two filter sections, one filter section will affect the electrical performance of the other filter section due to magnetic coupling between the two sections.

SUMMARY OF INVENTION

The object of the present invention is to provide a highly reliable, narrow and stable notch filter which is also easily tuned. This object is achieved with a notch filter having at least two filter sections which are magnetically isolated from one another and tuned independently from one another through the use of a novel shift tune process.

More specifically, a notch filter having a plurality of filter sections is provided, wherein each of a plurality of filter sections are magnetically separated from the others by a magnetic isolation area created by an isolation shield. Interconnecting conductors passing through the magnetic isolation area connect the filtering sections. The filtering sections are located on at least one circuit board having a contact area, and access to the contact area is provided through a filter housing which holds the circuit board. The contact area is used to frequency shift a first tuned filter section while a subsequent filter section is being tuned, so that the response of the first tuned filter section does not affect the tuning of the subsequent filter section.

The above-described "shift tuning" method is faster and less expensive than conventional tuning methods such as split tuning, illustrated in U.S. Pat. No. 4,451,803, as sophisticated tuning equipment is not required. In additional, the described notch filter structure and shift tuning process further improves the performance of the filter sections and promotes additive tuning which is made possible by isolation between filter sections. Further objects, features and advantages of the invention will be more clearly perceived from the ensuing description which is taken in connection with the accompanying drawings.

BRIEF DESCRIPTION OF THE DRAWINGS

With the above as background, reference should now be made to the following detailed description of the preferred embodiment of the invention and the accompanying drawings, wherein:

FIG. 3A is a sectional side view through a notch filter of the type illustrated in FIG. 2 and accompanying housing constructed in accordance with the invention;

FIG. 3B is a top plan view with center cutaway of the notch filter illustrated in FIG. 3A;

FIG. 4C is a data plot showing the results of tuning the second section while the first section is frequency shifted in accordance with the teachings of the invention.

DETAILED DESCRIPTION OF THE INVENTION

Figure 1:
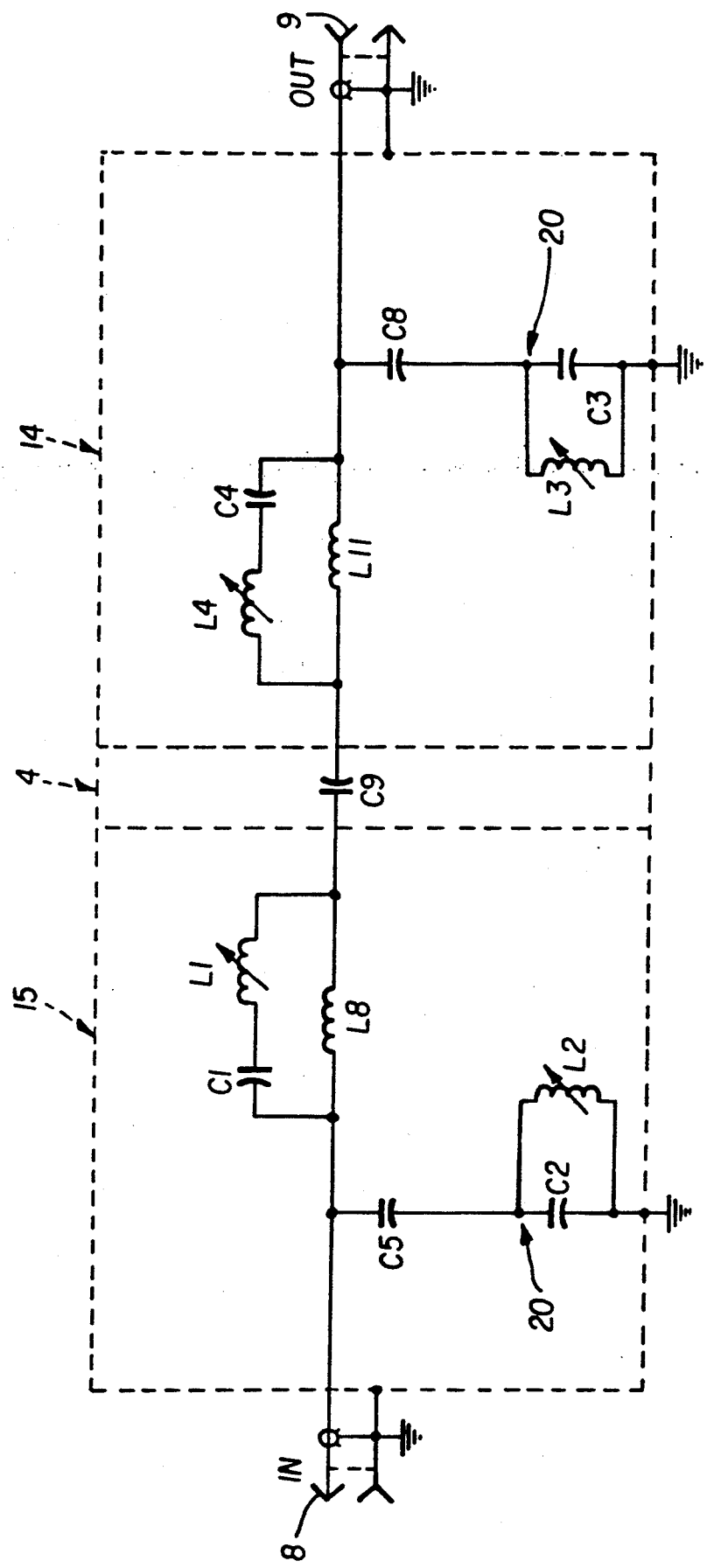
FIG. 1 is an electrical schematic of a notch filter in accordance with the invention.

An electrical schematic diagram of a notch filter constructed in accordance with the invention is illustrated in FIG. 1. An input terminal 8 is designed to receive an incoming television signal including one or more signals which are to be removed (attenuated) by the notch filter. Input terminal 8 is connected to one terminal of capacitor C5 which in turn is connected at its other terminal to a parallel arrangement of a capacitor C2 and inductor L2. This connection point in the circuit is also a contact point 20 which is used to cause a frequency shift to occur as will be described in greater detail below. The other terminal of the parallel arrangement of C2 and L2 is connected to a ground conductor. Terminal 8 is also connected to an input terminal of a network consisting of inductor L8 in parallel with a network consisting of capacitor C1 which is in series with an inductor L1. The circuit described thus far, up to an output terminal of the network just described, forms one filtering section 15 of the overall notch filter illustrated in FIG. 1.

The output terminal of the network of the filtering section 15 passes into the isolation area 4 and is connected to one terminal of a coupling capacitor C9. The other terminal of capacitor C9 connects into filtering section 14, the second filtering section of the overall notch filter, to an input terminal of a network consisting of an inductor L11 in parallel with a network consisting of an inductor L4 in series with a capacitor C4. An output terminal of this network is connected to the output terminal 9 of the overall notch filter. Output terminal 9 is also connected to one terminal of capacitor C8 which in turn is connected at its other terminal to a parallel arrangement of a capacitor C3 and inductor L3. This connection point in the circuit is also a contact point 20 which is used to cause a frequency shift to occur in the filtering section 14. The other terminal of the parallel arrangement of C3 and L3 is connected to a ground conductor.

FIG. 1 thus shows two separate filtering sections 14 and 15, the first existing between input terminal 8 and isolation area 4 and the second existing between isolation area 4 and output terminal 9. Filter housing 1, shown in FIG. 3A, is designed to allow access to either of the filtering sections, and specifically the contact areas 20 contained therein, through holes 16 so that each may be frequency shifted and thus tuned independent of each other. Thus, the tuning equipment employed to tune the overall filter need not be capable of measuring the depth of the notch produced by the filter by measuring across input terminal 8 and output terminal 9. Instead, the two filter sections can be independently tuned to the notch frequency without interrupting the connections from the test equipment to terminals 8 and 9, thereby reducing test time and eliminating the need for sophisticated measuring equipment. Typically, each filter section 14 and 15 produces a notch of approximately 45-50 dB and this is what the tuning equipment would be required to measure.

Figure 2:
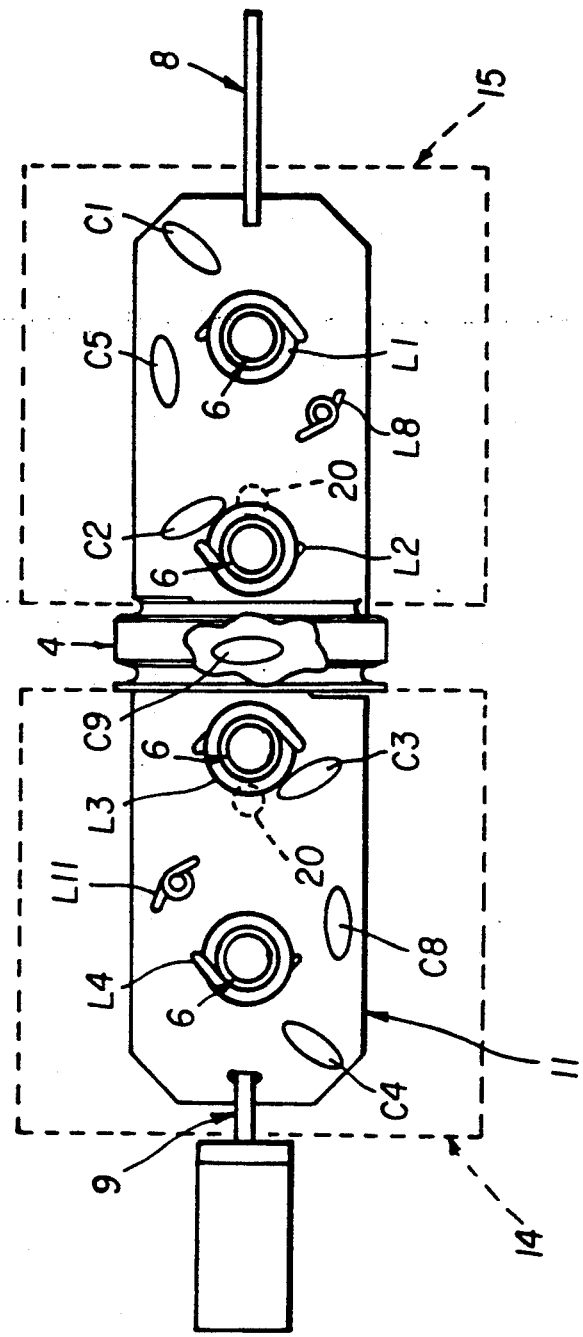
FIG. 2 is a top plan view of a notch filter constructed on a circuit board in accordance with the invention.

The two filter sections 14 and 15 are magnetically isolated to facilitate tuning of the overall notch filter. This is provided by the physical arrangement of the components on a circuit board and the provision of isolation shield 4. The physical arrangement of the components and the isolation area is shown in FIG. 1, 2 and 3A. The two filter sections 14 and 15 are shown in FIG. 1 and 2 by dotted lines. The two filter sections 14 and 15 are preferably commonly provided on a single circuit board 11, but are separated thereon by an isolation area 4. The isolation area contains a conductor which interconnects filter sections 14 and 15, while also providing magnetic isolation between filter sections 14 and 15, thus maximizing the additive attenuation.

To further improve the operating characteristics of the filter, the inductors L1 and L2 of filter section 15 have a space therebetween which is not occupied by any other electrical component. This space, along the longitudinal axis of the filter, is used to optimize magnetic coupling between inductors L1 and L2. A similar non-occupied space exists between inductors L3 and L4 of filter section 14. Accordingly, any magnetic coupling between the inductor pairs L1 and L2 and L3 and L4 will not adversely affect any other component to any significant degree.

FIGS. 3A and 3B illustrate the incorporation of the circuit board and component mounting illustrated in FIG. 2 within a suitable filter housing 1. Filter housing 1 is a cylindrical tube with holes 17 and 16 being provided to allow access to tuning slugs 5, shown in FIG. 3B, of the various inductor coils L1, L2, L3 and L4. A connector 18 is preferably provided integral with one end of the filter housing 1, while the other end is open. As shown in FIG. 3A, the outer diameter of isolation shield 4 is substantially equal to the inner diameter of filter housing 1. Isolation shield 4 is preferable affixed by two solder connections onto circuit board assembly 11 and the combined circuit board assembly 11 with the isolation shield 4 is slid into filter tube 1. A double solder connection is made between the outer diameter of isolation shield 4 and the inner diameter of filter tube 1 in such configuration that no non-electrically conductive line of sight path exists between opposite ends of filter tube 1. Accordingly, no non-conductive line of sight path exists between filter sections 14 and 15. A filter cap 2 is provided for attachment with the open end of filter housing 1. Filter cap 2 includes an internal screw threaded bore 19 for connection with an external cable and input terminal 8 passes through the screw threaded bore portion of filter cap 2. The filter housing 1 and filter cap 2 are interconnected by a press fit with the outer periphery of filter cap 2 fitting within the inner periphery of filter housing 1. Additional solder connections between the two may also be provided to further increase mechanical and electrical stability and reliability.

Filter housing 1 and filter cap 2 are in turn slid within and are surrounded by a tube sleeve housing 3. A pair of "O" rings 10 and 10 are provided respectively between inner periphery of filter of tube sleeve housing 3 and the outer periphery of filter housing 1 at one end and filter cap 2 at the other end to prevent water, moisture, etc. from entering into the interior of tube sleeve housing 3.

Prior to final notch filter assembly, the entire space within filter housing 1 and filter cap 2 may be filled with a two part liquid mix of polyurethane foam, which expands and solidifies to form a cohesive closed cell polyurethane mass 13, or some other dielectric material, which serves to rigidify component mounting and protect the filter from damage caused by shocks, vibrations, etc.

As illustrated in FIGS. 3A and 3B, contact areas 20 on the circuit board are accessible to the exterior of housing 1 through two holes 16 during the assembly process. These two holes 16, as well as tuning holes 17 used to access the tuning slugs 5, are covered when filter housing 1 is slid into tube sleeve housing 3. Accordingly, tuning of the filter occurs before the final assembly of filter housing 1 and filter cap 2 onto the tube sleeve housing 3.

By providing contact areas 20 in each of the two filter sections 14 and 15, independent tuning each of the filter sections is possible. As each of the filter sections 14 and 15 can be independently tuned, the cumulative effects of tuning one filter on another are minimized or eliminated. Accordingly, each filter section can be tuned with a much less sophisticated apparatus and repetitive back and forth tuning of the two filter sections can be minimized or avoided as each section can be independently tuned to a preferred center frequency, so that the effects of the two cascaded filter sections 14 and 15 provide an additive attenuation characteristic.

Figure 4A:
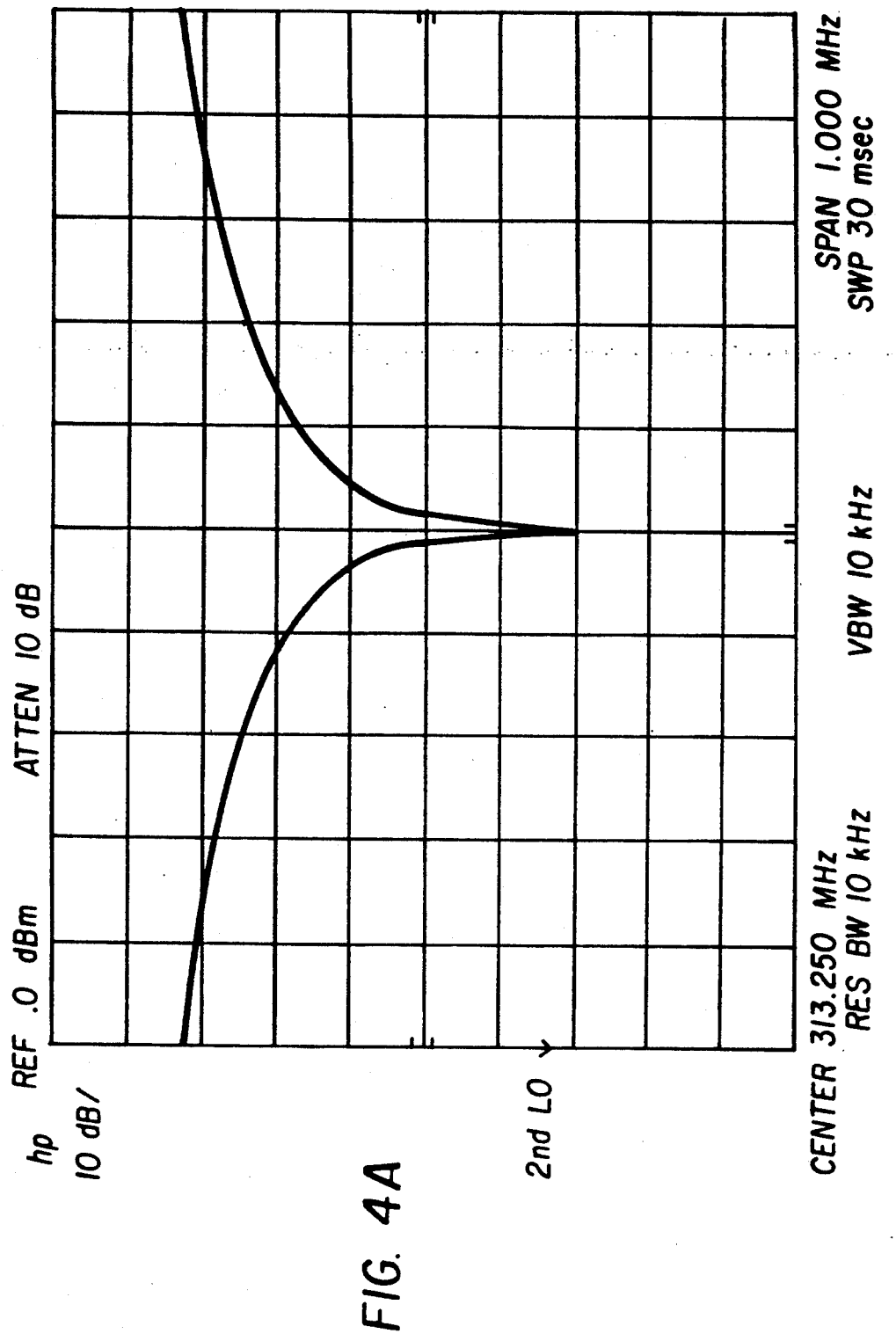
FIG. 4A is a data plot showing the results of tuning the first section of the filter to the desired frequency.
Figure 4B:
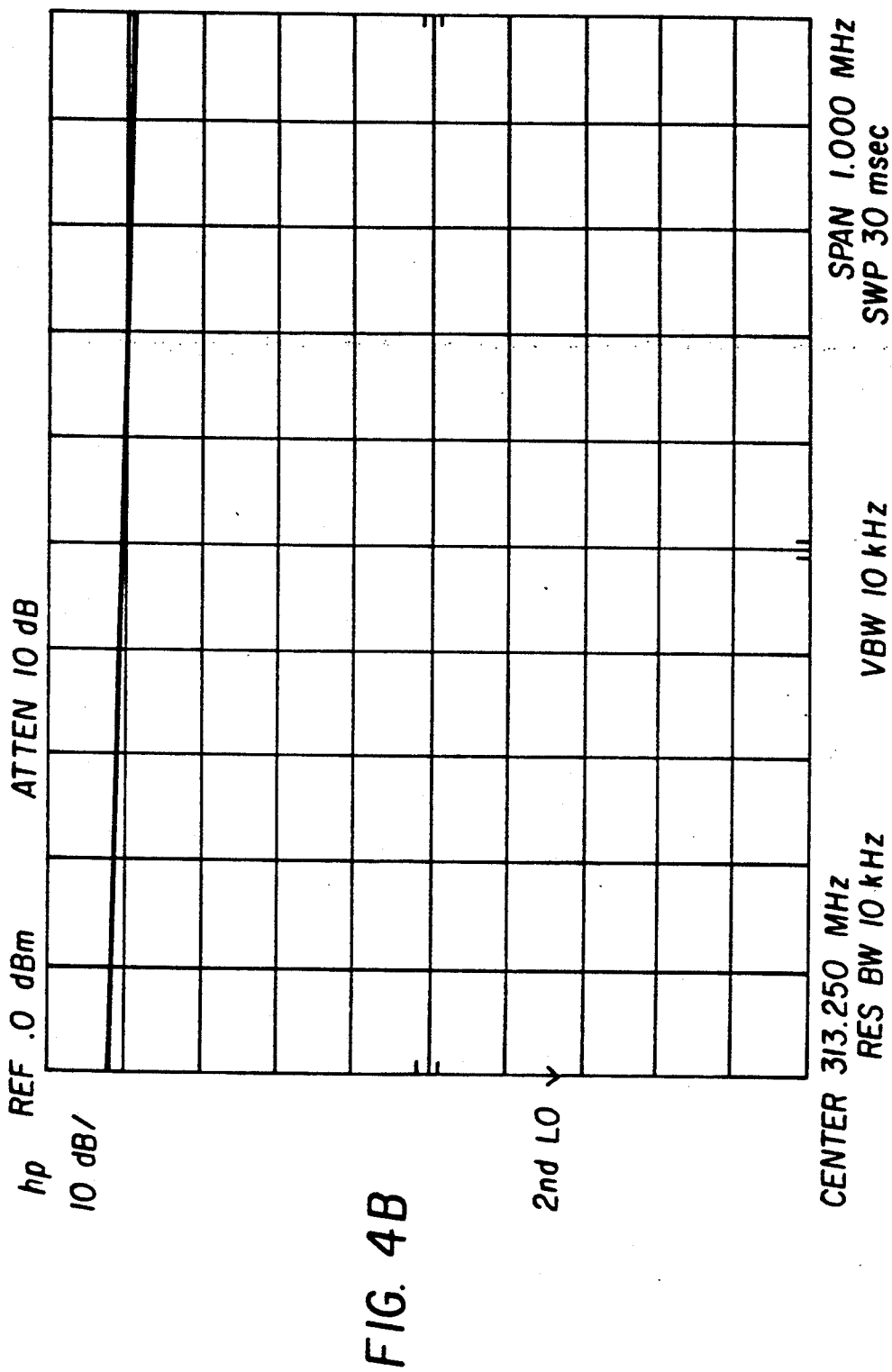
FIG. 4B is a data plot showing the results of frequency shifting the unit in accordance with the teachings of the invention.

A method of shift tuning the notch filter in accordance with the invention will now be described. Initially, the filter is built up to the point where it is ready to install in the outer sleeve 3. The filter is not tuned at this point. Test equipment is connected to the terminals 8 and 9. The first section 15 is then tuned to a center frequency $f_c$ by tuning inductors L1 and L2. The resultant data will be similar to that shown in FIG. 4A. The first section 15 is then frequency shifted by inserting a conductive probe 21 through access hole 16 to ground the contact point 20 of the first section 15. The resultant performance is shown in FIG. 4B. While the first section is frequency shifted, the second section 14 is tuned by adjusting inductors L3 and L4 to the center frequency $f_c$ as shown in FIG. 4C. The conductive probe 21 is then removed from contact point 20 and access hole 16 of the first section 15, which removes the frequency shift from the first section 15 such that both sections are now aligned to the center frequency $f_c$. If desired, the order of tuning can be changed, i.e., the second filter section 14 can be tuned first and then frequency shifted by the application of the conductive probe 21 to the contact point 20 in the second filter section 14 order to tune the first filter section 15.

Figure 4D:
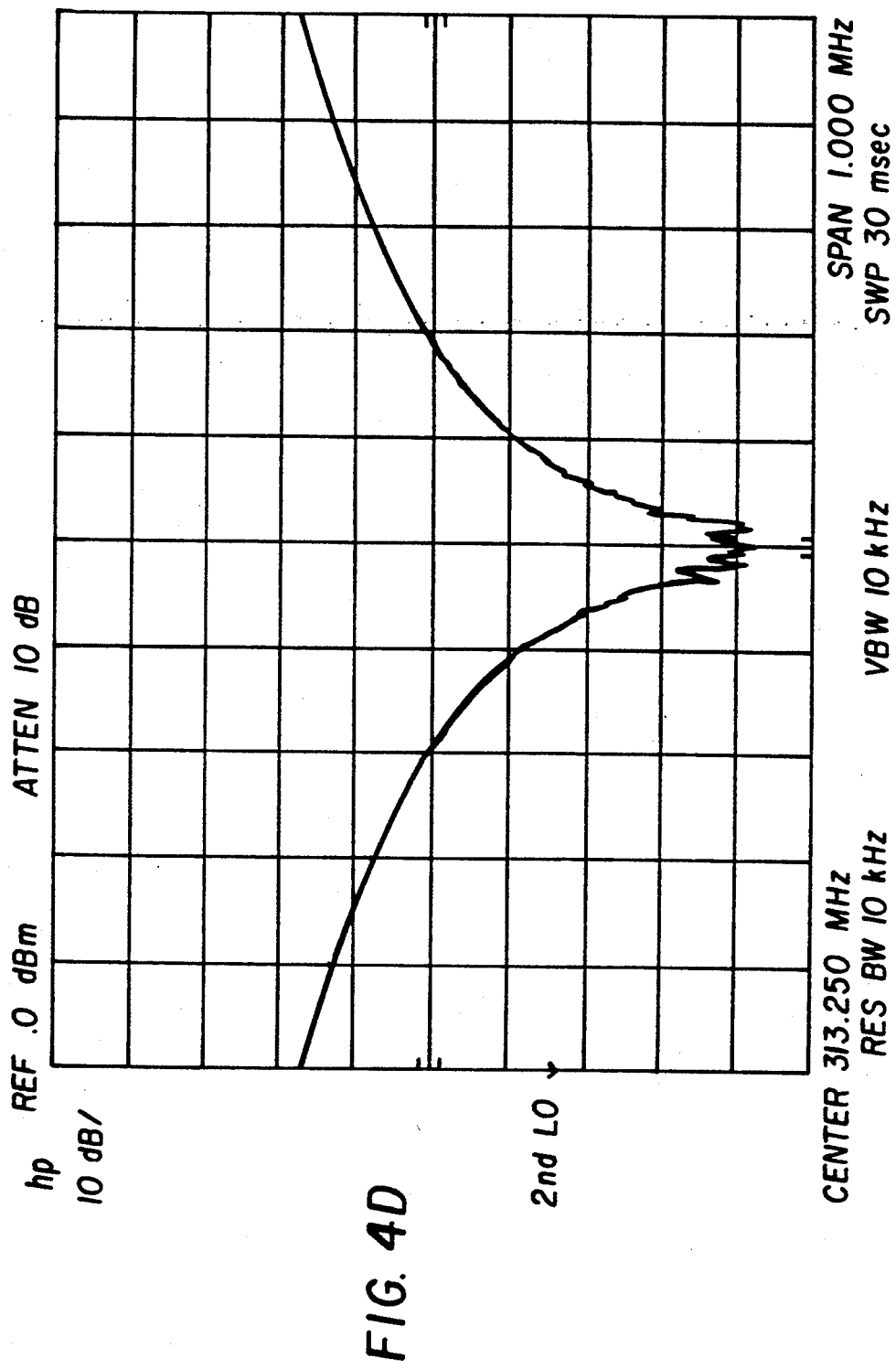
FIG. 4D is a data plot showing the additive results of both sections once they are both tuned and the frequency shift is removed in accordance with the teachings of the invention.

The resulting performance of the two tuned sections is shown in FIG. 4D. If the filter contains more than two sections which need to be tuned to the same frequency, then each section, as it is tuned, is frequency shifted by inserting a conductive probe 21 through access hole 16 to contact point 20 while all subsequent sections are tuned until all sections have been tuned. The conductive probes are then removed to obtain the additive results of all sections.

FIG. 4A and 4C illustrate the separate attenuation characteristics for each of the filter sections 14 and 15 when independently adjusted to a center frequency $f_c$. As shown, each filter section has an approximate attenuation of 50–60 dB. As illustrated in FIG. 4D, these attenuation characteristics are additive to produce an overall attenuation characteristic for the notch filter, between input terminal 9 and output terminal 8, of greater than 85–90 dB.

It should be understood that the contact point 20 need not necessarily be grounded to shift the response of the filter sections. For example, the capacitance of the conductive probe can be sufficient to shift the response of the filter sections without actually grounding the contact point. Thus, any procedure which shifts the response of a filter section to permit independent tuning can be employed.

Although the invention has been described above with reference to one specific filter structure, it should be appreciated that the invention can be applied in other applications without departing from its spirit or its scope. For example, although the invention has been described with reference to a notch filter having two sections, it should be apparent that the same teachings are applicable to isolate adjacent filter sections in a tuned filter having more than two such sections. Also, the teachings are applicable to tuned filters in general and could be applied to other types of multiple stage tuned devices and not just filters. Accordingly, the invention is not limited by the foregoing description, but may be modified within the scope of the appended claims.

What is claimed is:

1. A Method of tuning a filter including at least first and second isolated filtering sections, said method comprising the steps of: applying a test signal across an input of the first filtering section and an output of the second filtering section; tuning the operation of the first filtering section to a desired frequency; frequency shifting the operation of first filtering section from the desired frequency; tuning the operation of the second filtering section to the desired frequency; and removing the frequency shifting from the first filtering section in order to return the operation of the first filtering section to the desired frequency.

2. A method of tuning a filter including at least first and second isolated filtering sections, said method comprising the steps of:
   tuning the operation of the first filtering section to a desired frequency; frequency shifting the operation of first filtering section from the desired frequency; tuning the operation of the second filtering section to the desired frequency; and removing the frequency shifting from the first filtering section in order to return the operation of the first filtering section to the desired frequency;
   wherein the step of frequency shifting the first filtering section comprises the step of applying a conductive probe to a contact area of the first filtering section.

3. A method of manufacturing a tuned filter having at least first and second isolated filtering sections comprising: placing the first and second isolated filtering sections within a filter housing having access holes located therein; applying a test signal across an input of the first filtering section and an output of the second filtering section; tuning the first filtering section to a selected frequency by accessing tuning elements within the first filtering section via the access holes provided in the filter housing and adjusting the tuning elements; frequency shifting the operation of the first filtering section by passing a conductive probe through the access holes provided in the filter housing and placing the conductive probe in contact with a frequency shifting contact area within the first filtering section; tuning the second filtering section to the selected frequency by accessing tuning elements within the second filtering section via the access holes provided in the filter housing and adjusting the tuning elements; removing the frequency shifting from the first filtering section to return operation of the first filtering section to the selected frequency by withdrawing the conductive probe from the first filtering section; placing the first and second filtering sections within a sleeve housing; and sealing the sleeve housing.

4. A shift tuning filter structure comprising: p1 a first filter section including at least one frequency shifting contact area and at least one frequency tuning circuit element; a second filter section including at least one frequency tuning circuit element; an isolation section coupling an output of the first filter section to an input of the second filter section; and a filter housing;
   wherein the first filter section, the second filter section and the isolation section are located within the filter housing, and the filter housing includes access holes aligned with the tuning circuit element and the frequency shifting contact area of the first filter section, and the tuning circuit element of the second filter section.

5. A filter structure as claimed in claim 4, further comprising a filter sleeve which encloses the filter housing.

6. A filter structure as claimed in claim 5, wherein the first and second filter sections are located on a common circuit board.

* * * * *